US 11,647,603 B2

(12) United States Patent
Li et al.

(10) Patent No.: US 11,647,603 B2
(45) Date of Patent: May 9, 2023

(54) SERVER CONSTRUCTED WITH TRAYS FOR HARD DISK MODULES

(71) Applicant: Fulian Precision Electronics (Tianjin) Co., LTD., Tianjin (CN)

(72) Inventors: Han-Yu Li, New Taipei (TW); Wen-Hu Lu, Tianjin (CN); Shu-Tong Wang, Tianjin (CN); Li-Yi Yin, Tianjin (CN); Gong-Wen Zhang, Tianjin (CN); Yang Li, Tianjin (CN); San-Long Zhou, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 0 days.

(21) Appl. No.: 17/515,060

(22) Filed: Oct. 29, 2021

(65) Prior Publication Data
US 2023/0055697 A1    Feb. 23, 2023

(30) Foreign Application Priority Data
Aug. 18, 2021 (CN) .......................... 202110947407.5

(51) Int. Cl.
*H05K 7/14*        (2006.01)
(52) U.S. Cl.
CPC ......... *H05K 7/1489* (2013.01); *H05K 7/1491* (2013.01)
(58) Field of Classification Search
None
See application file for complete search history.

(56) References Cited

U.S. PATENT DOCUMENTS

| | | | | |
|---|---|---|---|---|
| 6,550,877 B1* | 4/2003 | Anderson | ............ | H05K 7/1489 312/265.5 |
| 7,599,183 B2* | 10/2009 | Dittus | ................ | H05K 7/20727 361/728 |
| 9,693,477 B1* | 6/2017 | Ehlen | .................... | H05K 7/1492 |
| 2010/0172087 A1* | 7/2010 | Jeffery | ................ | G11B 33/128 361/679.48 |
| 2013/0155604 A1* | 6/2013 | Lin | ......................... | G06F 1/187 361/725 |
| 2014/0029194 A1* | 1/2014 | Hayashi | ............... | H05K 7/1485 361/679.48 |
| 2014/0204540 A1* | 7/2014 | Lin | ...................... | H05K 7/1488 361/732 |
| 2015/0043146 A1* | 2/2015 | Li | ........................ | H05K 7/1487 361/679.31 |

(Continued)

FOREIGN PATENT DOCUMENTS

TW      201430837       8/2014

*Primary Examiner* — James Wu
*Assistant Examiner* — Christopher L Augustin
(74) *Attorney, Agent, or Firm* — ScienBiziP, P.C.

(57) ABSTRACT

A server containing hard disk modules which can be slid into place and which allow connection at the front and at the rear of a housing. The server includes the housing which defines an opening, the hard disk modules, and a plurality of trays. Receiving channels communicating with the opening are defined in the housing, the receiving channels are isolated and arranged side by side and each channel can receive one tray. A hard disk module is positioned in one tray, a front end and a rear end of the housing defines front connection port and rear connection port for cable connections to each hard disk module.

18 Claims, 5 Drawing Sheets

(56) References Cited

U.S. PATENT DOCUMENTS

| | | | |
|---|---|---|---|
| 2015/0092340 A1* | 4/2015 | Jau | H05K 7/1487 |
| | | | 361/679.39 |
| 2016/0132078 A1* | 5/2016 | Shen | G06F 11/2005 |
| | | | 361/679.32 |
| 2016/0219748 A1* | 7/2016 | Tsai | H05K 7/1487 |
| 2018/0184539 A1* | 6/2018 | Zhang | H05K 7/1491 |
| 2018/0352679 A1* | 12/2018 | Monson | G11B 33/142 |
| 2019/0124785 A1* | 4/2019 | Ehlen | H05K 7/1491 |
| 2019/0269040 A1* | 8/2019 | Gao | H05K 7/1488 |
| 2020/0389993 A1 | 12/2020 | Wang et al. | |

* cited by examiner

SERVER CONSTRUCTED WITH TRAYS FOR HARD DISK MODULES

FIELD

The subject matter herein generally relates to server construction, especially relates to a server with trays.

BACKGROUND

Servers today include more and more hard disks. Cables electrically connected to the hard disks are electrically connected to other electronic components through a connection port positioned on a back shell of the server. Thus, arrangement of hard disks is restricted by the location of the connection port, which is not conducive to the utilization of space in server.

Therefore, there is room for improvement within the art.

BRIEF DESCRIPTION OF THE DRAWINGS

Implementations of the present technology will now be described, by way of embodiments with reference to the attached figures.

DETAILED DESCRIPTION

Figure 1:
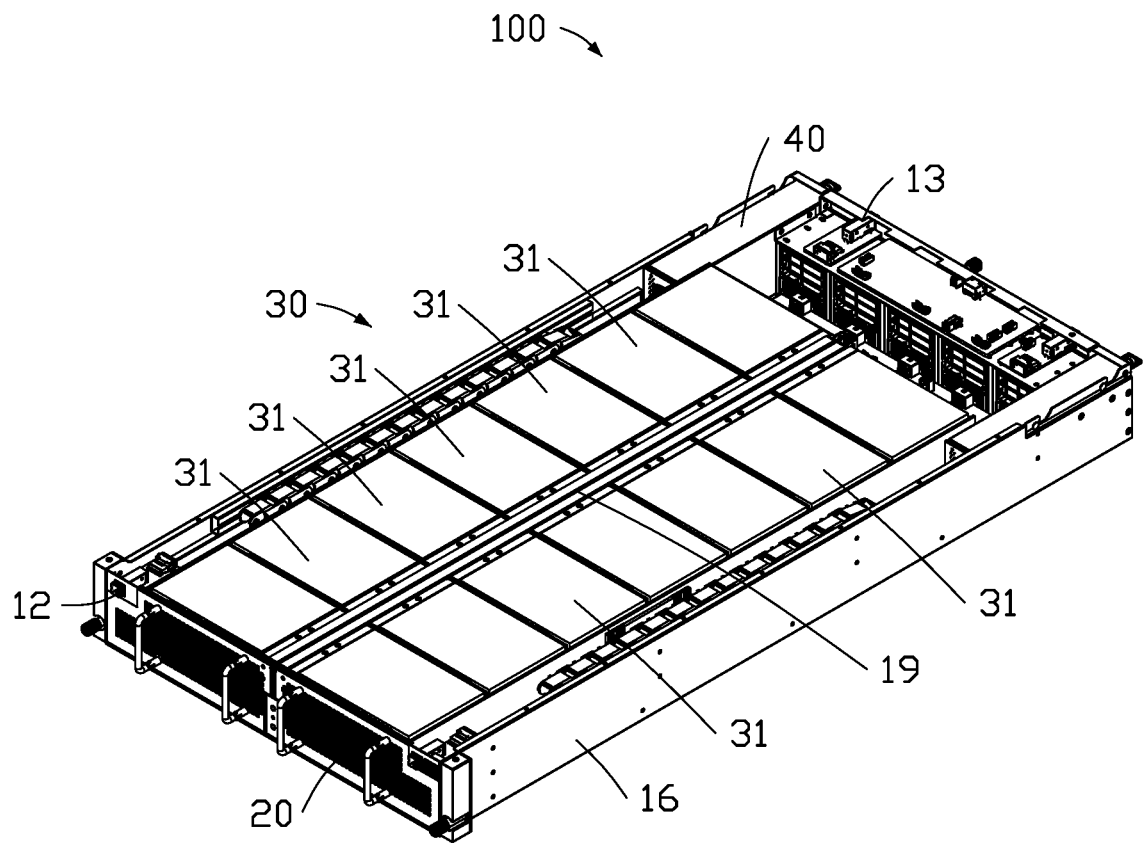
FIG. 1 is an isometric view of a server with a top shell removed.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better show details and features of the present disclosure. The disclosure is by way of embodiments and not by way of limitation in the figures of the accompanying drawings, in which like references indicate similar elements. It should be noted that references to "an" or "one" embodiment in this disclosure are not necessarily to the same embodiment, and such references mean "at least one."

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like. References to "a plurality of" and "a number of" mean "at least two."

Figure 5:
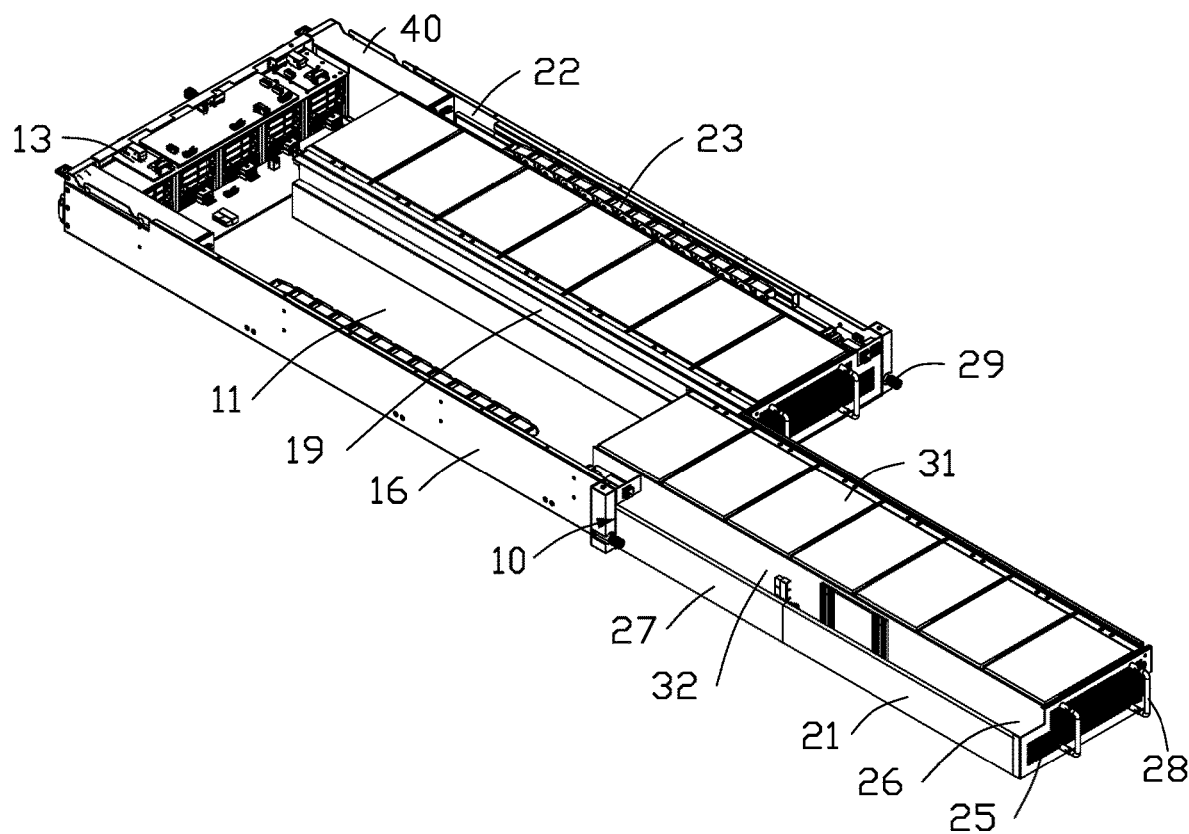
FIG. 5 is similar to FIG. 1, but with hard disk module pulled from housing.

Referring to FIGS. 1 to 5, a server 100 is provided. The server 100 includes a housing (not labeled), a plurality of trays 20 and a plurality of hard disk modules 30 disposed in the trays 20. Each tray 20 receives one hard disk module 30. Referring to FIG. 5, each hard disk module 30 includes a plurality of hard disks 31 and a hard disk backplane 32 is electrically connected to the plurality of hard disks 31. A plurality of cables (not shown) extend from the hard disk backplane 32 for connecting to external electronic components. The housing defines an opening 10 and a plurality of receiving channels 11 communicating with the opening 10. The receiving channels 11 are isolated and arranged side by side. The front and rear ends of the casing are provided with a front connection port 12 and a rear connection port 13. The trays 20 are slidably placed in the receiving channels 11 side by side. The cables on the hard disk backplane 32 on each tray 20 are connected to the either the front connection port 12, the rear connection port 13, or to both. The hard disks 31 on each tray 20 can be pulled out of the housing and pushed into the housing.

Figure 2:
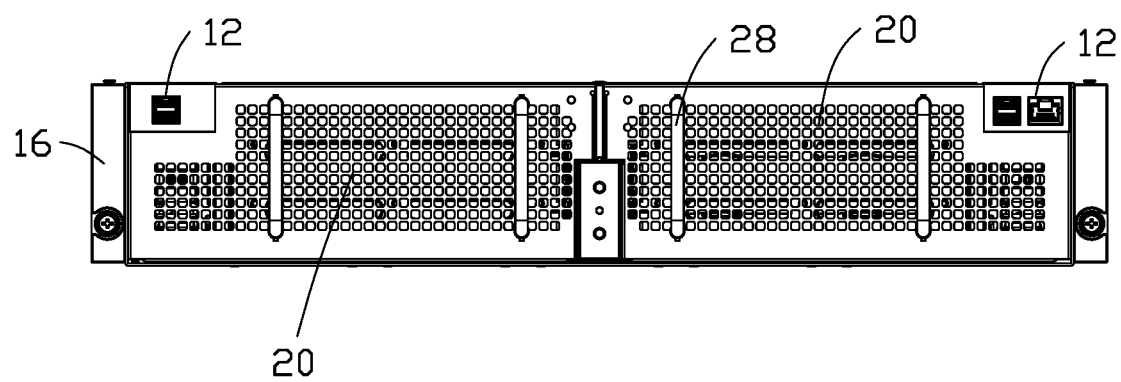
FIG. 2 is a front view of the server in FIG. 1.
Figure 3:
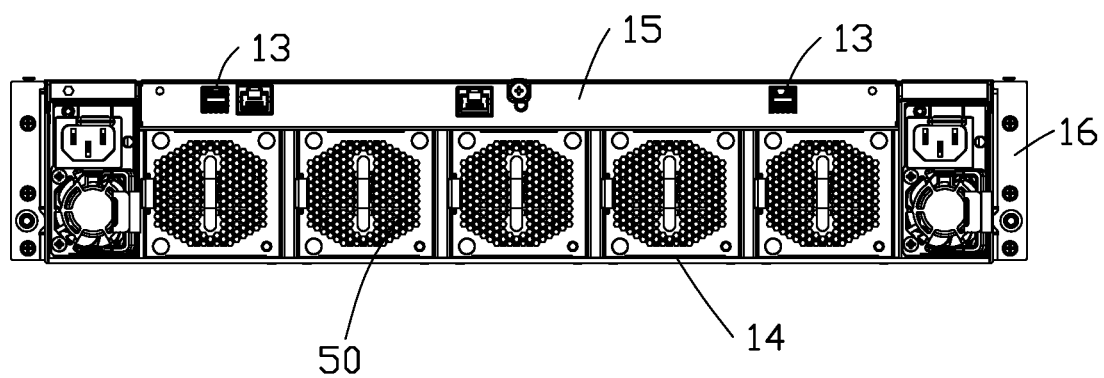
FIG. 3 is a rear view of the server in FIG. 1.
Figure 4:
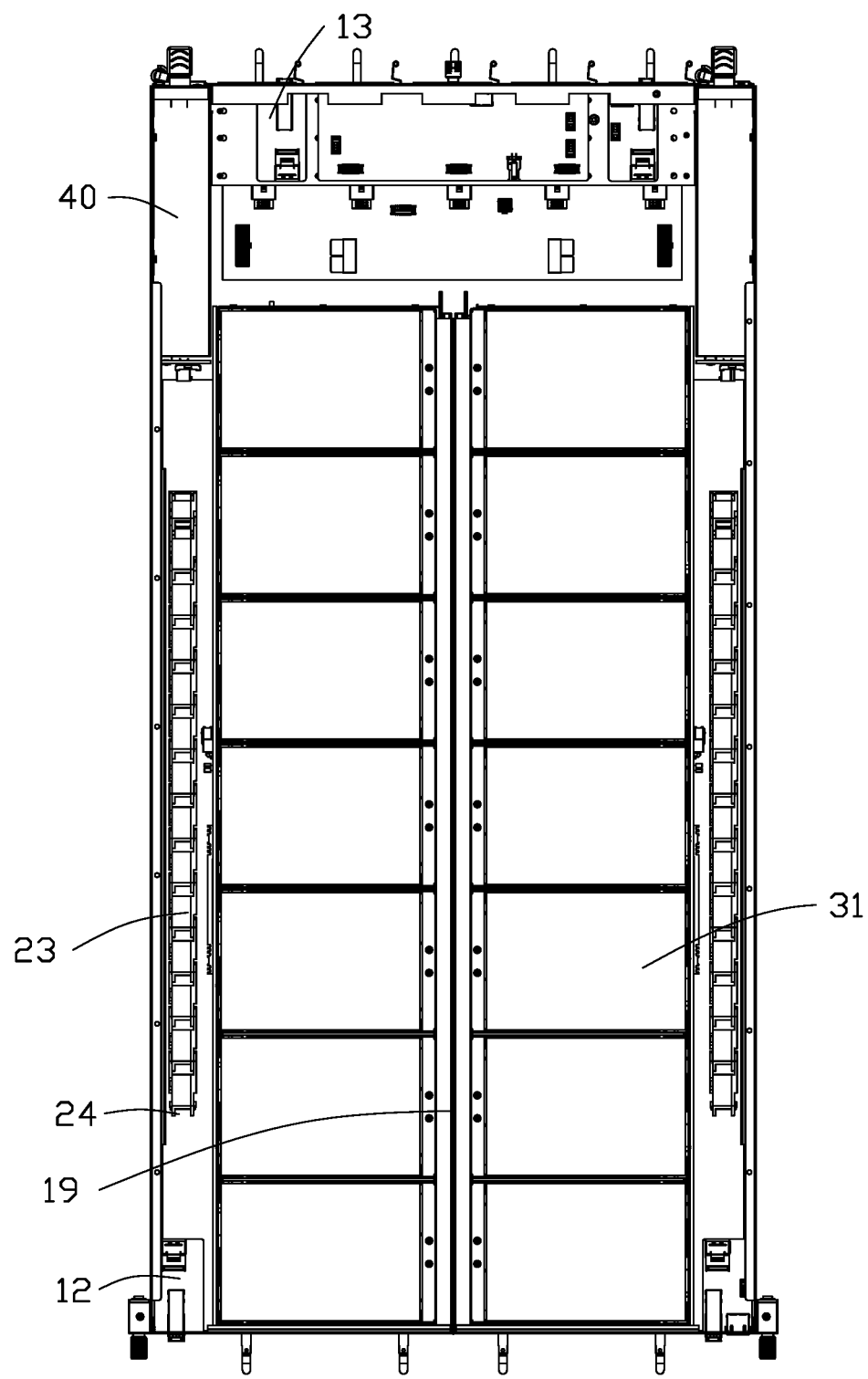
FIG. 4 is a top view of the server of FIG. 1.

Referring to FIG. 3, in an embodiment, the housing includes a bottom shell 14, a top shell (not shown), a rear shell 15 connected to one ends of the bottom shell 14 and the top shell, and side shells 16 connected to sides of the bottom shell 14 and the top shell. Referring to FIG. 2, two front connection ports 12 are positioned at two ends of the inner side of the side shell 16. Referring to FIG. 3, a plurality of rear connection ports 13 are positioned on the rear shell 15. It can be understood that the number of front connection ports 12 and rear connection ports 13 is not limited to two, there may be one or more than two. Referring to FIGS. 1 and 3, two power modules 40 are arranged at intervals at the rear shell 15 and fan modules 50 are arranged between the two power modules 40. Referring to FIG. 5, a plurality of receiving channels 11 faces the fan module 50 so as to dissipate heat of the hard disk module 30 out of the housing to improve the heat dissipation efficiency of the server 100. At least one separating plate 19 is fixed on the bottom shell 14 and positioned between the two trays 20. The tray 20 is slidably placed between the side shell 16 and the separating plate 19 adjacent to the side shell 16 or between two adjacent separating plates 19. The tray 20 is slidably connected to the side shell 16 and the separating plate 19 on a sliding rail. In an embodiment, the separating plate 19 has a predetermined thickness and forms a ventilation channel passing through the separating plate 19, and the ventilation channel is opposite to the fan module 50 to dissipate heat from two adjacent hard disk modules 30. In the embodiment shown in FIG. 1, the server 100 includes two trays 20, and one separating plate 19 is fixed on the bottom shell 14. In other embodiments, the server 100 includes three, four, or more trays 20, and correspondingly, two, three, or more separating plates 19 are fixed on the bottom shell 14.

Referring to FIG. 5, the tray 20 includes a U-shaped container 21 and a connecting plate 27 slidably connected to both sides of the container 21. The connecting plate 27 is slidably connected to the housing. The hard disks 31 are placed in the U-shaped container 21, and the hard disk backplane 32 is positioned on the side of the hard disks 31 opposite to the side shell 16. The depth of the U-shaped container 21 is greater than the height of the hard disk 31, and the U-shaped container 21 accommodates three layers of hard disks 31. Each layer of hard disks 31 includes seven hard disks 31 arranged along the direction of the receiving channels 11. It can be understood that the number of layers of the hard disks 31 and the number of hard disks 31 on each layer can be set according to requirements. A gap 22 is defined between the hard disk backplane 32 and the U-shaped container 21. A chain 23 is arranged in the gap 22, and the chain 23 defines an entrance (not shown) and an exit 24. The cable extends from the entrance to the exit 24 along the extension direction of the chain 23 to connect to the front connection port 12 or to the rear connection port 13. An end of the chain 23 defining the exit 24 is fixed to the bottom shell 14, and an end of the chain 2 defining the entrance is fixed to the U-shaped container 21 or the hard disk backplane 32. The chain 23 gradually straightens as the tray 20 is pulled out of the housing, and gradually slackens as the tray 20 is pushed into the housing to form a symmetrical U-shape. Therefore, when the tray 20 is pulled out of the housing or the hard disk 31 is pushed into the housing, the cables move with the chain 23 to protect the cables. The power module 40 and the front connection port 12 are opposite to the gap 22 where the chain 23 is placed, so that the drag chain 23, the power module 40 and the front connection port 12 are located in a channel where the gap 22 is located. Thus, space utilization of server 100 is improved.

The tray 20 further includes a blocking plate 25 connected to the front end of the U-shaped container 21. The blocking plate 25 defines a notch 26 on a side of the blocking plate 25 close to the side shell 16. The front connection port 12 is received in the notch 26, so that after the tray 20 is pushed into the housing, the housing and the tray 20 present an integral appearance. In addition, due to the notch 26, other space is not occupied by the front connection port 12, which is beneficial to reduce the height space in the direction perpendicular to the bottom shell 14. A handle 28 is fixed on the blocking plate 25 to pull the hard disk 31 out of the housing or push the hard disk 31 into the housing. The blocking plate 25 is also provided with a first connecting portion (not shown), and a second connecting portion (not shown) is provided on the housing. A fastener 29 is detachably fixed the first connecting portion and the second connecting portion, so that when the hard disk 31 is pushed into the housing, the tray 20 and the housing are fixed by the fastener 29, and when the fastener 29 is removed, the tray 20 can be pulled out of the housing. The first connecting portion and the second connecting portion can be threaded holes, and the fastener 29 can be a thumb screw. Through-holes are also formed on the blocking plate 25, the through holes can allow the heat generated by the hard disk 31 to be dissipated out of the tray 20.

The server 100 is provided with a front connection port 12 and a rear connection port 13 at the front and rear of the housing, the cables of the hard disk module 30 located in the housing can be electrically connected to electronic components through the front connection port 12 at the front of the housing, and also can be electrically connected to the electronic components through the rear connection port 13 at the rear of the housing. The arrangement of the hard disk modules 30 allows for greater adaptability and flexibility, and multiple parallel trays 20 can be independently pulled out the housing and pushed into the housing, so that the server 100 has a higher space utilization rate and facilitates maintenance of the hard disk module 30.

The embodiments shown and described above are only examples. Therefore, many commonly-known features and details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. A server comprising:
   a housing, defining an opening;
   a plurality of hard disk modules positioned in the housing; and
   a plurality of trays, wherein:
   the housing further defines a plurality of receiving channels communicating with the opening,
   the plurality of receiving channels are isolated and arranged side by side,
   the plurality of trays are received in the receiving channels, each of the plurality of hard disk module is positioned in one of the plurality of trays, and
   a front end and a rear end of the housing defines at least one front connection port and at least one rear connection port for connecting cables of the hard disk module;
   the housing comprises a bottom shell, a top shell, a rear shell connected to bottom shell, the top shell, and two side shells;
   the two side shells connected to two sides of the bottom shell;
   ends of the two side shells are arranged at the opening, and one of the at least one front connection port is provided at each end of the two side shells; and
   two of the at least one rear connection port are positioned on the rear shell.

2. The server of claim 1, wherein two power modules are arranged at intervals at the rear shell and fan modules are arranged between the two power modules.

3. The server of claim 2, wherein:
   at least one separating plate is fixed on the bottom shell and positioned between two of the plurality of trays; and
   each of the plurality of trays is slidably placed between one of the two side shells and the separating plate adjacent to the one of the two side shells or between two adjacent separating plates.

4. The server of claim 3, wherein:
   the separating plate has a predetermined thickness and forms a ventilation channel passing through the separating plate; and
   the ventilation channel is opposite to the fan module.

5. The server of claim 2, wherein:
   each of the plurality of hard disk modules comprises a plurality of hard disks and a hard disk backplane electrically connected with the plurality of hard disks;
   the cables connected with external electronic components protrude from the hard disk backplane; and
   two hard disk backplanes are each respectively positioned on a respective side of two of the plurality of hard disk modules, and positioned opposite to the two side shells.

6. The server of claim 5, wherein:
   each of the trays comprises a U-shaped container;
   two gaps are defined between the two hard disk backplanes and two U-shaped containers;
   the server further comprises two chain received in the two gaps, each chain has an entrance and an exit;
   the cables extends from the entrance to the exit along an extension direction of the chain to connect two front connection ports at least one front connection port or two rear connection ports at least one rear connection port; and each chain is connected to corresponding tray and moves with corresponding tray.

7. The server of claim 6, wherein the two power modules and the at least one front connection ports are opposite to the two gaps receiving the two chains.

8. The server of claim 6, wherein:
each of the plurality of tray further comprises a blocking plate connected to a front end of its respective U-shaped container;
each blocking plate defines a notch on a side of the blocking plate close to one of the two side shells; and
each front connection port is received in one of the notch.

9. The server of claim 1, wherein each of the plurality of trays receives a multi-layer hard disk, and each layer of the multi-layer hard disk is comprised of a plurality of hard disks arranged along a direction of the receiving channel.

10. A server comprising:
a bottom shell;
a rear shell, connected to one end of the bottom shell;
two side shells, connected to two sides of the bottom shell, wherein an opening is defined between the two side shells;
a plurality of hard disk modules, positioned on the bottom shell; and
a plurality of trays, wherein:
a plurality of receiving channels are defined between the two side shells and communicating with the opening,
the plurality of receiving channels are isolated and arranged side by side,
the plurality of trays are received in the receiving channels,
each hard disk module is positioned in each of the plurality of trays, and
a front end of one of the two side shells and the rear shell defines at least one front connection port and at least one rear connection port for connecting cables of the hard disk module;
ends of the two side shells are arranged at the opening, and one of the at least one front connection port is provided at each end of the two side shells; and
a plurality of the at least one rear connection port are positioned on the rear shell.

11. The server of claim 10, wherein two power modules are arranged at intervals at the rear shell and fan modules are arranged between the two power modules.

12. The server of claim 11, wherein:
at least one separating plate is fixed on the bottom shell and positioned between two of the plurality of trays; and
each of the plurality of trays is slidably placed between one of the two side shells and the separating plate adjacent to the one of the two side shells or between two adjacent separating plates.

13. The server of claim 12, wherein:
the separating plate has a predetermined thickness and forms a ventilation channel passing through the separating plate; and
the ventilation channel is opposite to the fan module.

14. The server of claim 11, wherein:
each of the plurality of hard disk modules comprises a plurality of hard disks and a hard disk backplane electrically connected with the plurality of hard disks;
the cables connected with external electronic components protrude from the hard disk backplane; and
two hard disk backplanes are each respectively positioned on a respective side of two of the plurality of hard disk modules, and positioned opposite to the two side shells.

15. The server of claim 14, wherein:
each of the trays comprises a U-shaped container;
two gaps are defined between the two hard disk backplanes and two U-shaped containers;
the server further comprises two chain received in the two gaps, each chain has an entrance and an exit;
the cables extends from the entrance to the exit along an extension direction of the chain to connect two front connection ports at least one front connection port or two rear connection ports at least one rear connection port; and
each chain is connected to corresponding tray and moves with corresponding tray.

16. The server of claim 15, wherein the two power modules and the at least one front connection ports are opposite to the two gaps receiving the two chains.

17. The server of claim 15, wherein:
each of the plurality of tray further comprises a blocking plate connected to a front end of its respective the U-shaped container;
each blocking plate defines a notch on a side of the blocking plate close to one of the two side shells; and
each front connection port is received in one of the notch.

18. The server of claim 10, wherein each of the plurality of tray receives a multi-layer hard disk, and each layer of the multi-layer hard disk is comprised a plurality of hard disks arranged along a direction of the receiving channel.

* * * * *